US012666682B2

(12) United States Patent
Xie et al.

(10) Patent No.: US 12,666,682 B2
(45) Date of Patent: Jun. 23, 2026

(54) VERTICAL TRANSPORT TRANSISTOR DEVICES WITH BACK SIDE INTERCONNECTS

(71) Applicant: International Business Machines Corporation, Armonk, NY (US)

(72) Inventors: Ruilong Xie, Niskayuna, NY (US); Brent A. Anderson, Jericho, VT (US); Lawrence A. Clevenger, Saratoga Springs, NY (US); Nicholas Anthony Lanzillo, Wynantskill, NY (US); Reinaldo Vega, Mahopac, NY (US); Albert M. Chu, Nashua, NH (US)

(73) Assignee: International Business Machines Corporation, Armonk, NY (US)

( * ) Notice: Subject to any disclaimer, the term of this patent is extended or adjusted under 35 U.S.C. 154(b) by 442 days.

(21) Appl. No.: 17/901,133

(22) Filed: Sep. 1, 2022

(65) Prior Publication Data

US 2024/0079462 A1     Mar. 7, 2024

(51) Int. Cl.
| | |
|---|---|
| *H10D 64/23* | (2025.01) |
| *H10D 30/01* | (2025.01) |
| *H10D 30/63* | (2025.01) |
| *H10D 64/01* | (2025.01) |
| *H10D 84/83* | (2025.01) |
| *H10P 95/00* | (2026.01) |

(52) U.S. Cl.
CPC ......... *H10D 64/252* (2025.01); *H10D 30/025* (2025.01); *H10D 30/63* (2025.01); *H10D 64/01* (2025.01); *H10D 84/83* (2025.01); *H10P 95/11* (2026.01)

(58) Field of Classification Search
CPC ...... H10B 63/34; H10D 30/63; H10D 84/016; H10D 84/0195; H10D 30/0291–0297; H10D 30/66–669; H10D 64/252; H10D 30/025; H10D 64/01; H10D 84/83; H10D 84/0149; H10D 84/038; H10P 95/11; H10W 20/0698; H10W 20/427; H10W 20/023; H10W 20/0245; H10W 20/069; H10W 20/481
See application file for complete search history.

(56) References Cited

U.S. PATENT DOCUMENTS

| | | | | |
|---|---|---|---|---|
| 9,219,032 | B2 * | 12/2015 | Ramachandran ... | H10W 20/023 |
| 9,356,043 | B1 * | 5/2016 | Sakakibara ............ | H10B 43/10 |

(Continued)

FOREIGN PATENT DOCUMENTS

| | | |
|---|---|---|
| KR | 2021-0098294 A | 8/2021 |
| WO | 2017058299 A1 | 4/2017 |

OTHER PUBLICATIONS

S. Das et al., "Transistors Based on Two-dimensional Materials for Future Integrated Circuits," Nature Electronics, Nov. 2021, pp. 786-799, vol. 4.

*Primary Examiner* — Maliheh Malek
(74) *Attorney, Agent, or Firm* — L. Jeffrey Kelly; Ryan, Mason & Lewis, LLP

(57) ABSTRACT

A semiconductor structure comprises a vertical transistor, a first contact connecting to a source/drain region at a first side of the vertical transistor, a second contact extending from the first side of the vertical transistor to a second side of the vertical transistor, and an interconnect structure at the first side of the vertical transistor connecting the first contact to the second contact.

18 Claims, 12 Drawing Sheets

(56) References Cited

U.S. PATENT DOCUMENTS

| | | | | |
|---|---|---|---|---|
| 9,595,535 | B1* | 3/2017 | Ogawa | H10B 43/50 |
| 9,666,578 | B1* | 5/2017 | Anderson | H10D 84/141 |
| 9,728,542 | B1* | 8/2017 | Balakrishnan | H10D 30/031 |
| 9,780,088 | B1* | 10/2017 | Balakrishnan | H10D 62/129 |
| 9,799,570 | B1* | 10/2017 | Cheng | H10D 30/6728 |
| 9,799,655 | B1* | 10/2017 | Cheng | H10D 30/63 |
| 9,812,461 | B2* | 11/2017 | Doda | H10D 30/63 |
| 9,865,730 | B1* | 1/2018 | Jagannathan | H10D 30/025 |
| 9,954,102 | B1* | 4/2018 | Mochizuki | H10D 30/63 |
| 9,960,271 | B1* | 5/2018 | Xie | H10D 84/038 |
| 9,997,413 | B1* | 6/2018 | Leobandung | H10D 84/0195 |
| 10,062,752 | B1* | 8/2018 | Leobandung | H10D 62/119 |
| 10,079,230 | B2* | 9/2018 | Stuber | H10D 84/641 |
| 10,170,577 | B1* | 1/2019 | Lee | H10D 64/671 |
| 10,229,986 | B1* | 3/2019 | Jagannathan | H10D 30/63 |
| 10,242,994 | B2* | 3/2019 | Inomata | H10B 41/27 |
| 10,361,315 | B1* | 7/2019 | Yeh | H10D 30/63 |
| 10,388,760 | B1* | 8/2019 | Frougier | H10D 30/023 |
| 10,418,484 | B1* | 9/2019 | Xie | H10D 84/016 |
| 10,468,525 | B1* | 11/2019 | Cheng | H10D 30/63 |
| 10,522,658 | B1* | 12/2019 | Cheng | H10D 64/021 |
| 10,529,851 | B1* | 1/2020 | Mochizuki | H10D 30/63 |
| 10,573,723 | B1* | 2/2020 | Ando | H10D 64/015 |
| 10,777,465 | B2* | 9/2020 | Xie | H10D 30/025 |
| 11,476,163 | B2* | 10/2022 | Xie | H10D 84/83 |
| 11,476,346 | B2* | 10/2022 | Zhang | H10D 64/021 |
| 11,615,990 | B2* | 3/2023 | Wu | H10D 30/63 257/329 |
| 11,670,588 | B2* | 6/2023 | Jezewski | H10D 99/00 257/66 |
| 11,757,010 | B2* | 9/2023 | Chen | H10D 64/01 257/382 |
| 12,255,204 | B2* | 3/2025 | Xie | H10D 30/63 |
| 2007/0075359 | A1* | 4/2007 | Yoon | H10D 30/025 257/329 |
| 2009/0152611 | A1* | 6/2009 | Fujimoto | H10D 30/63 438/269 |
| 2016/0233270 | A1* | 8/2016 | Takaki | H10N 70/011 |
| 2017/0294377 | A1* | 10/2017 | Dunga | H10B 63/34 |
| 2017/0358607 | A1* | 12/2017 | Balakrishnan | H10D 87/00 |
| 2017/0373159 | A1* | 12/2017 | Cheng | H10D 64/021 |
| 2018/0122913 | A1* | 5/2018 | Xie | H10D 30/6219 |
| 2018/0190670 | A1* | 7/2018 | Ryckaert | H10D 62/122 |
| 2018/0254218 | A1* | 9/2018 | Cheng | H10D 84/038 |
| 2018/0301555 | A1* | 10/2018 | Balakrishnan | H10D 30/63 |
| 2018/0315850 | A1* | 11/2018 | Liu | H10D 30/63 |
| 2018/0337256 | A1* | 11/2018 | Anderson | H10D 30/025 |
| 2018/0342507 | A1* | 11/2018 | Xie | H10D 30/025 |
| 2018/0350953 | A1* | 12/2018 | Balakrishnan | H10D 30/025 |
| 2019/0097064 | A1* | 3/2019 | Leobandung | H10D 30/6728 |
| 2019/0172924 | A1* | 6/2019 | Jagannathan | H10D 30/63 |
| 2019/0172927 | A1* | 6/2019 | Jagannathan | H10D 62/116 |
| 2019/0198400 | A1* | 6/2019 | Miao | H10D 64/021 |
| 2019/0214307 | A1* | 7/2019 | Xie | H10D 84/0128 |
| 2019/0214343 | A1* | 7/2019 | Lee | H10D 84/0195 |
| 2019/0259854 | A1* | 8/2019 | Jagannathan | H10D 62/116 |
| 2019/0326435 | A1* | 10/2019 | Yeung | H10D 30/025 |
| 2019/0355830 | A1* | 11/2019 | Balakrishnan | H10D 30/62 |
| 2019/0363026 | A1* | 11/2019 | Lee | H10D 30/63 |
| 2019/0378836 | A1* | 12/2019 | Wang | H10D 88/00 |
| 2019/0378837 | A1* | 12/2019 | Miao | H10D 30/6735 |
| 2019/0386062 | A1* | 12/2019 | Wang | H10B 61/22 |
| 2020/0052094 | A1* | 2/2020 | Mochizuki | H10D 30/025 |
| 2020/0066630 | A1* | 2/2020 | Bao | H10D 30/6219 |
| 2020/0075723 | A1* | 3/2020 | Lee | H10D 62/151 |
| 2020/0098863 | A1* | 3/2020 | Bi | H10D 84/0128 |
| 2020/0105759 | A1* | 4/2020 | Bowonder | H10D 64/254 |
| 2020/0119010 | A1* | 4/2020 | Lee | H10D 62/822 |
| 2020/0135873 | A1* | 4/2020 | Wu | H10D 30/6219 |
| 2020/0144416 | A1* | 5/2020 | Zhang | H10D 84/83 |
| 2020/0152766 | A1* | 5/2020 | Jagannathan | H10D 30/63 |
| 2020/0176333 | A1* | 6/2020 | Lee | H10D 30/63 |
| 2020/0219804 | A1* | 7/2020 | Jezewski | H10D 99/00 |
| 2020/0273755 | A1* | 8/2020 | Wu | H10D 84/016 |
| 2020/0279779 | A1* | 9/2020 | Li | H10D 30/63 |
| 2020/0295175 | A1* | 9/2020 | Liu | H10D 30/62 |
| 2020/0303497 | A1* | 9/2020 | Yeh | H10D 30/63 |
| 2020/0321448 | A1* | 10/2020 | Xu | H10D 30/0215 |
| 2020/0328127 | A1* | 10/2020 | Yamashita | H10D 62/151 |
| 2020/0343241 | A1* | 10/2020 | Wu | H10D 84/0149 |
| 2020/0350403 | A1* | 11/2020 | Basker | H10D 30/63 |
| 2020/0357898 | A1* | 11/2020 | Lee | H10D 30/025 |
| 2020/0381300 | A1* | 12/2020 | Zhang | H10D 30/6728 |
| 2020/0403065 | A1* | 12/2020 | Lee | H10D 30/6757 |
| 2021/0035902 | A1* | 2/2021 | Kang | H10D 84/0149 |
| 2021/0074823 | A1* | 3/2021 | Glass | H10D 64/256 |
| 2021/0098294 | A1* | 4/2021 | Smith | H10D 84/0149 |
| 2021/0098500 | A1* | 4/2021 | Wang | H10D 84/0158 |
| 2021/0098597 | A1* | 4/2021 | Xie | H10D 30/63 |
| 2021/0273063 | A1* | 9/2021 | Wu | H10D 64/252 |
| 2021/0305364 | A1* | 9/2021 | Li | H10D 30/025 |
| 2021/0327766 | A1* | 10/2021 | Wang | H10D 84/0149 |
| 2021/0336013 | A1* | 10/2021 | Chen | H10D 64/01 |
| 2022/0130977 | A1* | 4/2022 | Lin | H10D 84/853 |
| 2022/0181258 | A1* | 6/2022 | Liebmann | H10W 20/427 |
| 2022/0181321 | A1* | 6/2022 | Kang | H10D 84/85 |
| 2022/0293638 | A1* | 9/2022 | Wang | H10D 86/215 |
| 2023/0085838 | A1* | 3/2023 | Zhang | H10D 30/63 257/329 |
| 2023/0086960 | A1* | 3/2023 | Xie | H10D 30/025 257/329 |
| 2023/0139379 | A1* | 5/2023 | Xie | H10D 84/038 257/288 |
| 2023/0145135 | A1* | 5/2023 | Mignot | H10D 30/63 257/288 |
| 2023/0197777 | A1* | 6/2023 | Dewey | H10D 62/118 257/288 |
| 2023/0223276 | A1* | 7/2023 | Tsao | H10P 90/1908 |
| 2023/0378259 | A1* | 11/2023 | Xie | H10D 62/118 |
| 2024/0072051 | A1* | 2/2024 | Anderson | H10D 84/85 |
| 2024/0079461 | A1* | 3/2024 | Anderson | H10D 30/6728 |
| 2024/0079462 | A1* | 3/2024 | Xie | H10D 64/252 |
| 2024/0155822 | A1* | 5/2024 | Anderson | H10B 10/12 |
| 2024/0203985 | A1* | 6/2024 | Xie | H10D 84/0186 |
| 2024/0204100 | A1* | 6/2024 | Xie | H10D 30/63 |
| 2024/0213252 | A1* | 6/2024 | Anderson | H10D 84/907 |
| 2025/0280601 | A1* | 9/2025 | Xie | H10D 86/60 |
| 2025/0324654 | A1* | 10/2025 | Kang | H10D 30/63 |

* cited by examiner

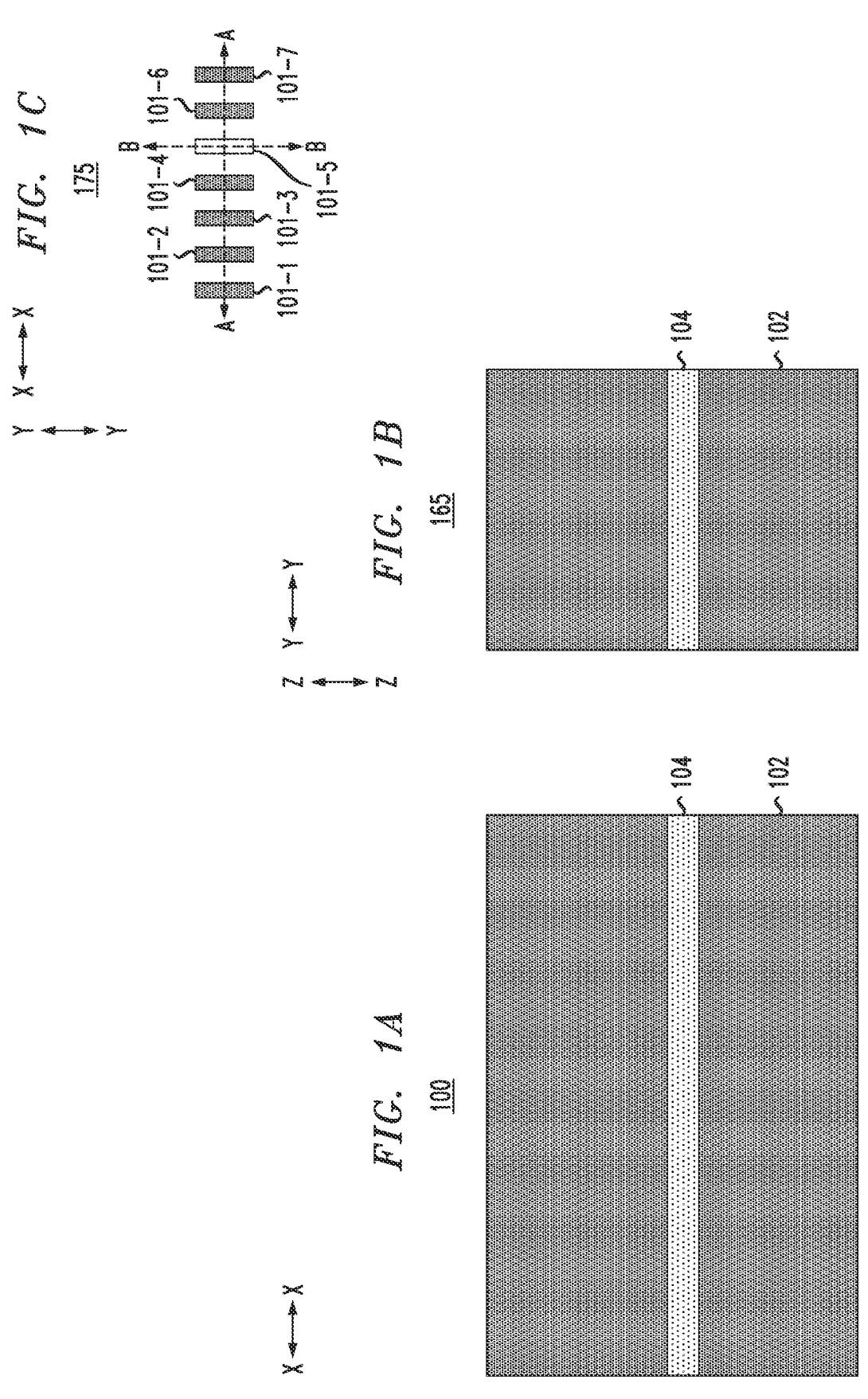

200

265

275

375

365

300

475

465

400

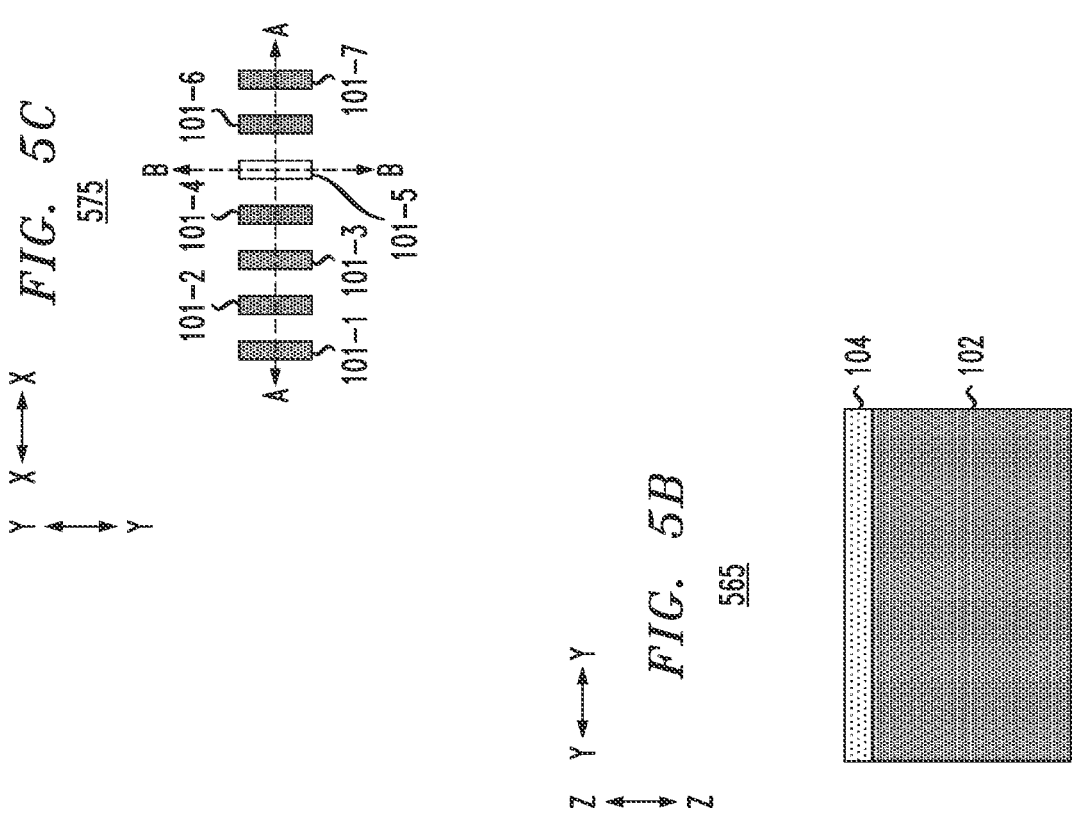
*FIG. 5C*
575
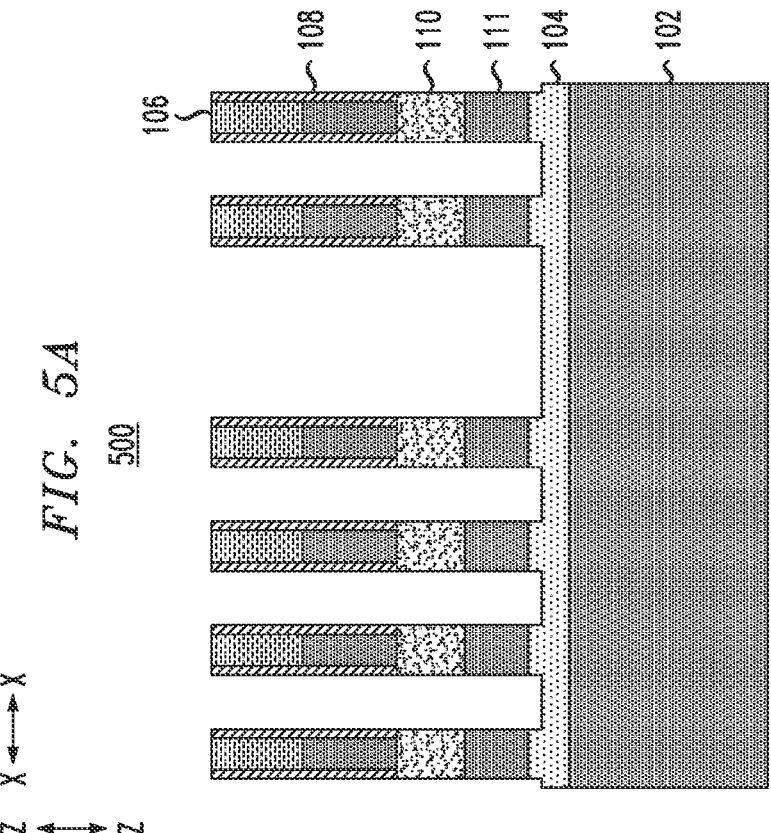
*FIG. 5B*
565
*FIG. 5A*
500

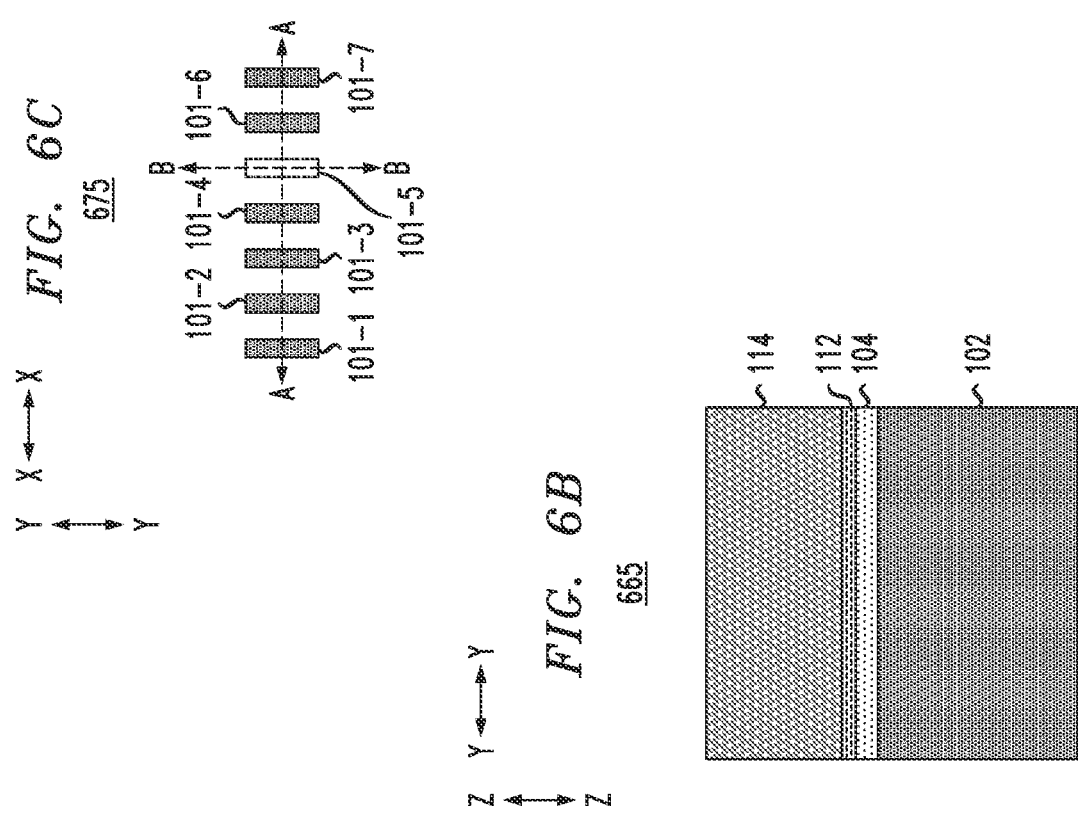
FIG. 6C
675
FIG. 6B
665
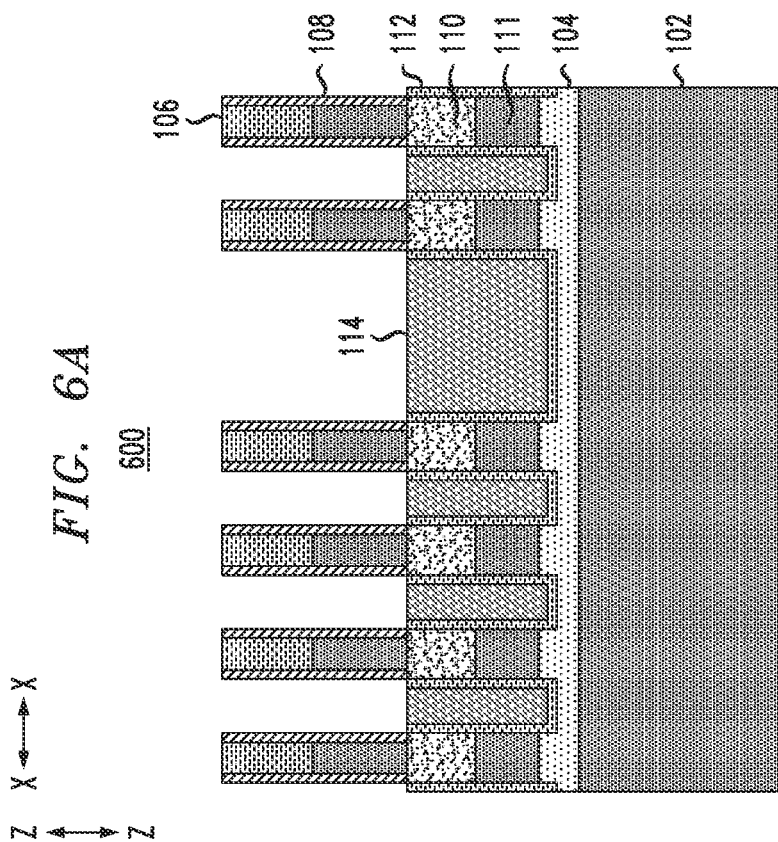
FIG. 6A
600

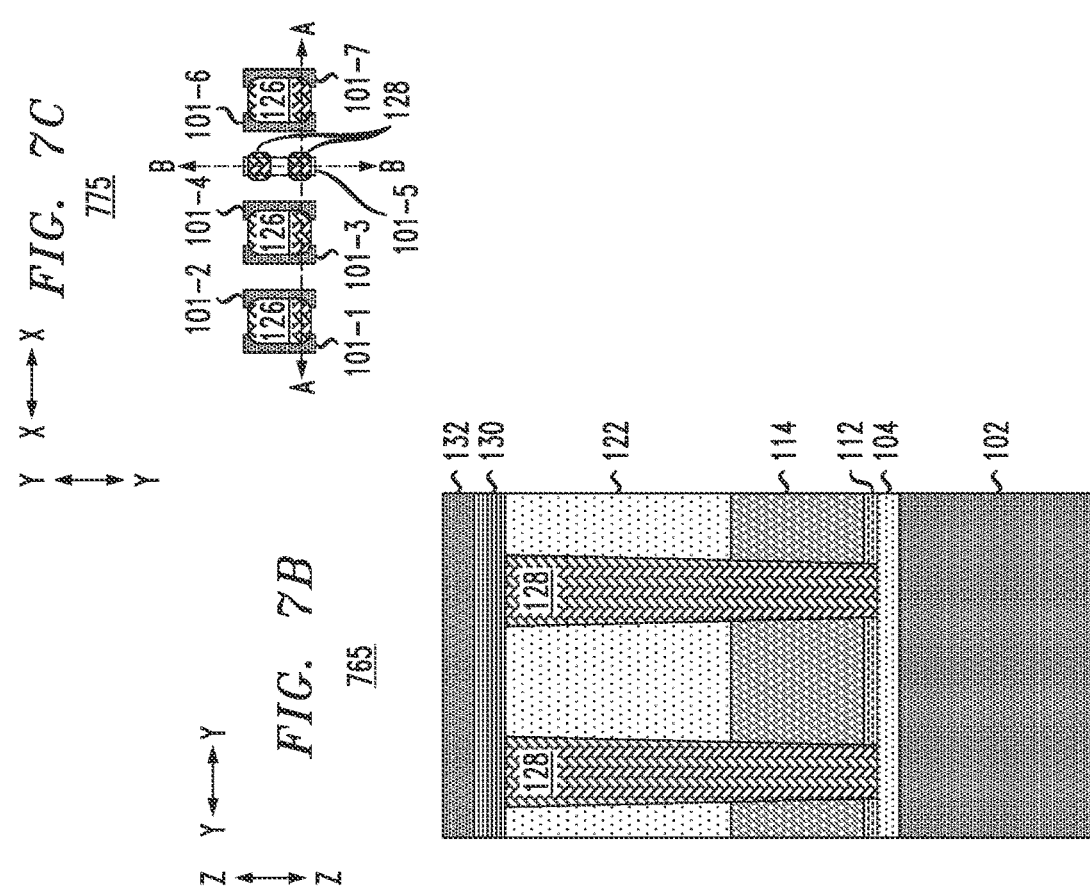
*FIG. 7C*
775
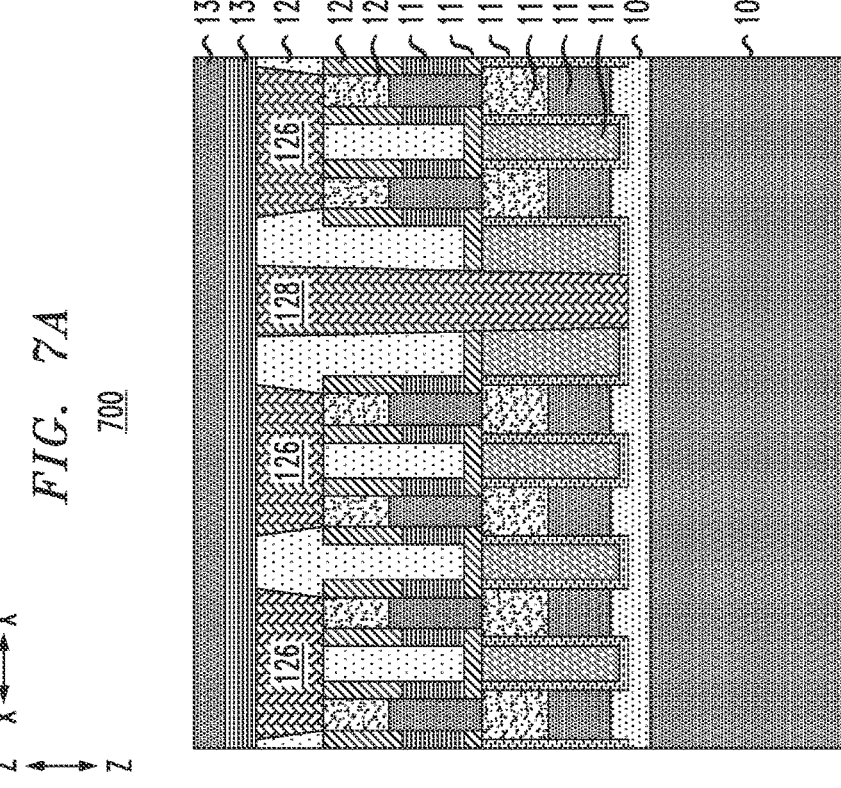
*FIG. 7B*
765
*FIG. 7A*
700

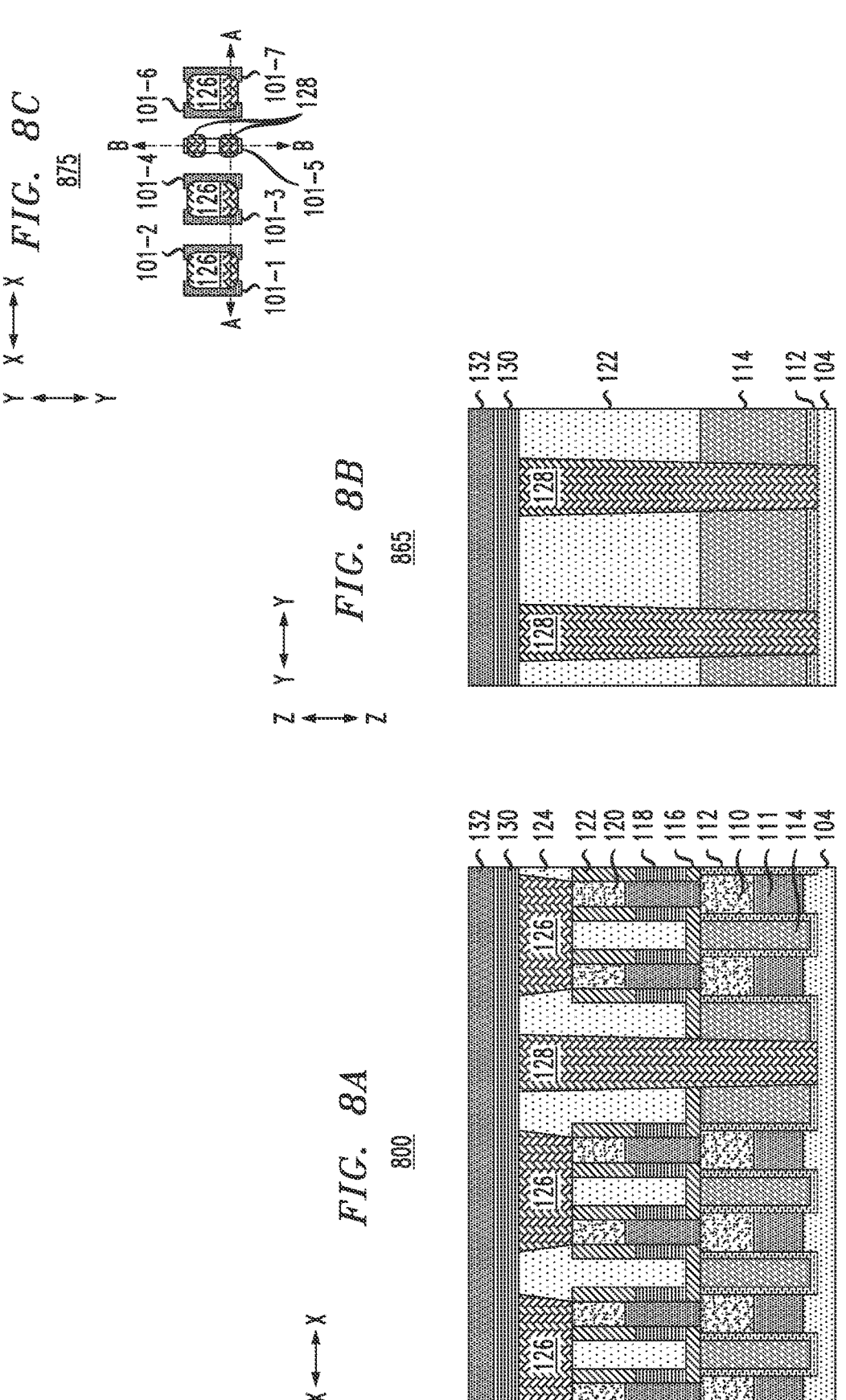

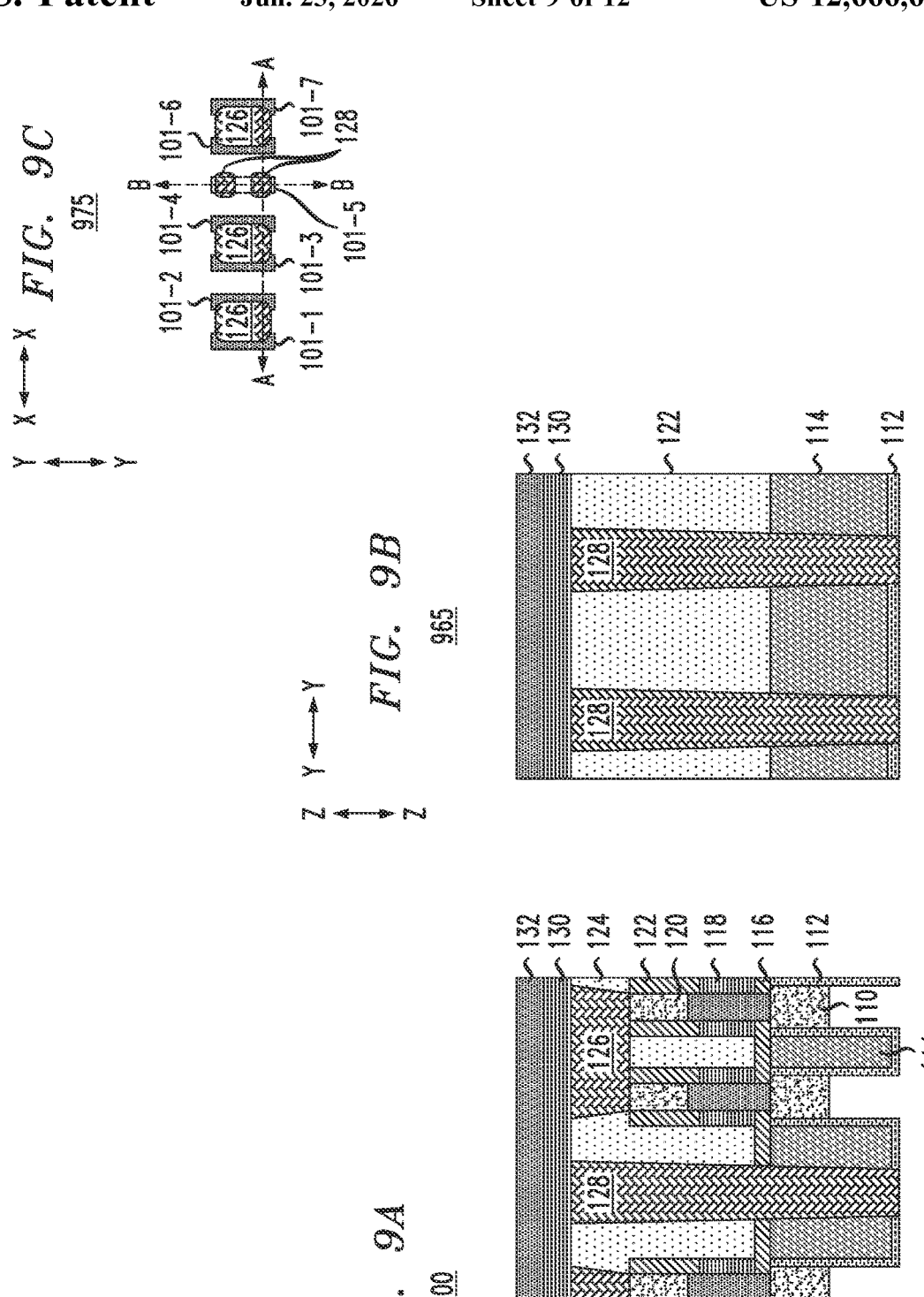

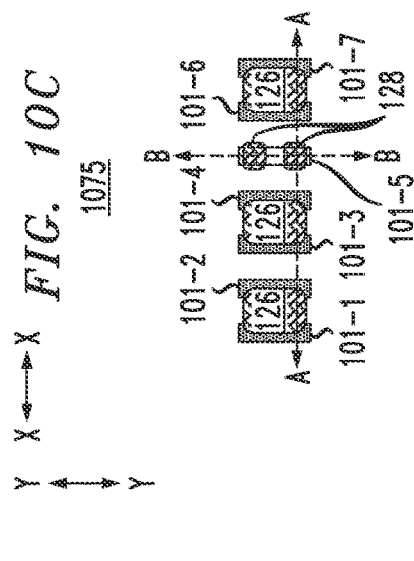
*FIG. 10C*
1075
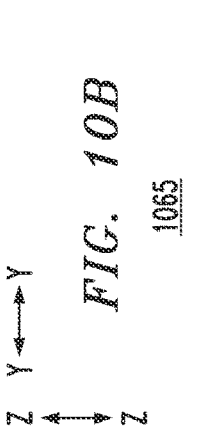
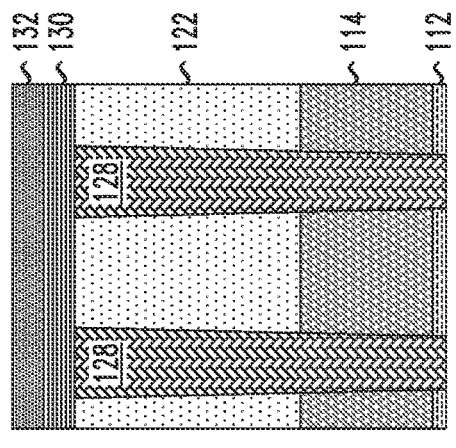
*FIG. 10B*
1065
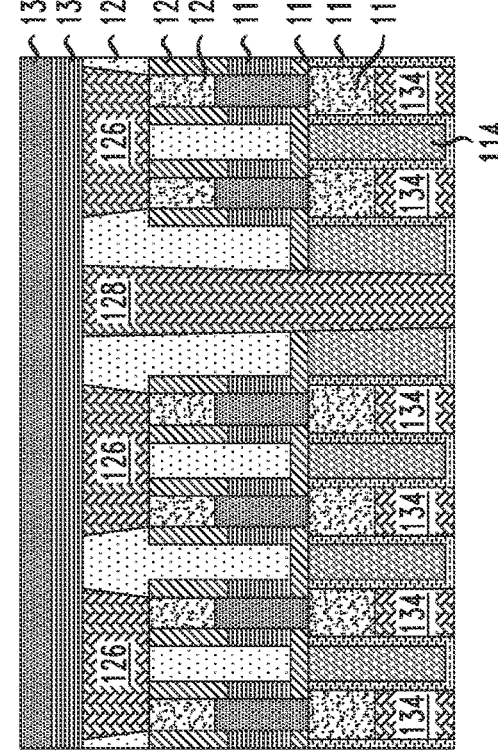
*FIG. 10A*
1000

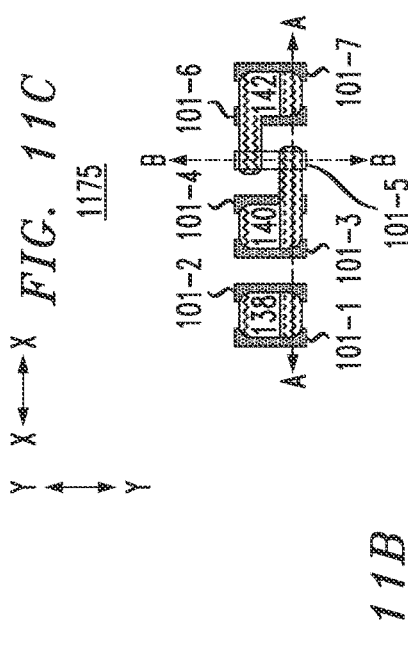
*FIG. 11C*
1175
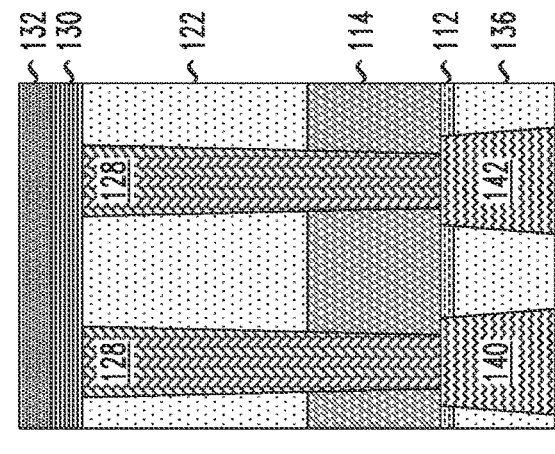
*FIG. 11B*
1165
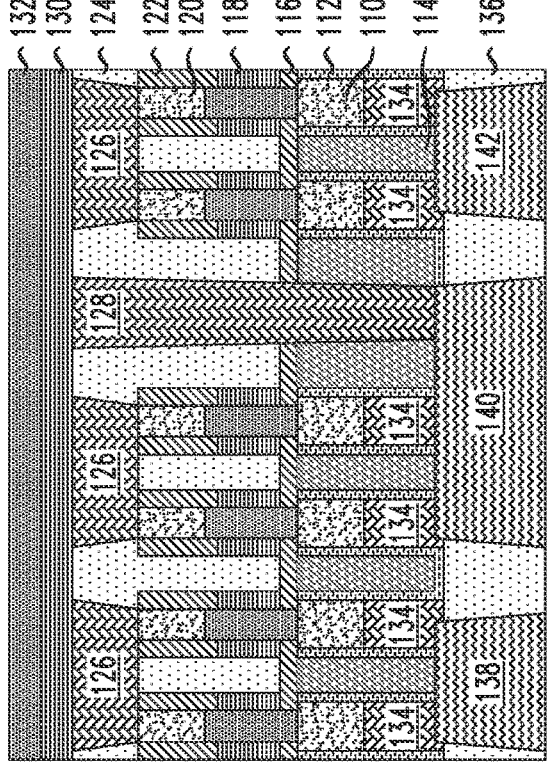
*FIG. 11A*
1100

1275

1265

1200

| INTEGRATED CIRCUIT | 1300 |
|---|---|
| VERTICAL TRANSPORT TRANSISTOR DEVICES WITH BACK SIDE INTERCONNECTS | 1310 |

VERTICAL TRANSPORT TRANSISTOR DEVICES WITH BACK SIDE INTERCONNECTS

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming vertical transport transistor devices with back side interconnects.

In one embodiment, a semiconductor structure comprises a vertical transistor, a first contact connecting to a source/drain region at a first side of the vertical transistor, a second contact extending from the first side of the vertical transistor to a second side of the vertical transistor, and an interconnect structure at the first side of the vertical transistor connecting the first contact to the second contact.

In another embodiment, an integrated circuit comprises a semiconductor structure comprising a vertical transistor, a first contact connecting to a source/drain region at a first side of the vertical transistor, a second contact extending from the first side of the vertical transistor to a second side of the vertical transistor, and an interconnect structure at the first side of the vertical transistor connecting the first contact to the second contact.

In another embodiment, a method comprises forming a vertical transistor, forming a first contact connecting to a source/drain region at a first side of the vertical transistor, forming a second contact extending from the first side of the vertical transistor to a second side of the vertical transistor, and forming an interconnect structure at the first side of the vertical transistor connecting the first contact to the second contact.

These and other features and advantages of embodiments described herein will become more apparent from the accompanying drawings and the following detailed description.

BRIEF DESCRIPTION OF THE DRAWINGS

FIG. 1A depicts a first side cross-sectional view of a structure following formation of a substrate with an etch stop layer, according to an embodiment of the invention.

FIG. 1B depicts a second side cross-sectional view of a structure following formation of a substrate with an etch stop layer, according to an embodiment of the invention.

FIG. 1C depicts a top-down view of a structure following formation of a substrate with an etch stop layer, according to an embodiment of the invention.

FIG. 5A depicts a first side cross-sectional view of the structure of FIGS. 4A-4C following active region patterning, according to an embodiment of the invention.

FIG. 5B depicts a second side cross-sectional view of the structure of FIGS. 4A-4C following the active region patterning, according to an embodiment of the invention.

FIG. 5C depicts a top-down view of the structure of FIGS. 4A-4C following the active region patterning, according to an embodiment of the invention.

FIG. 6A depicts a first side cross-sectional view of the structure of FIGS. 5A-5C following formation of shallow trench isolation structures, according to an embodiment of the invention.

FIG. 6B depicts a second side cross-sectional view of the structure of FIGS. 5A-5C following the formation of the shallow trench isolation structures, according to an embodiment of the invention.

FIG. 6C depicts a top-down view of the structure of FIGS. 5A-5C following the formation of the shallow trench isolation structures, according to an embodiment of the invention.

FIG. 7A depicts a first side cross-sectional view of the structure of FIGS. 6A-6C following formation of bottom spacers, gates, middle-of-line contacts and back-end-of-line interconnects, and bonding to a carrier wafer, according to an embodiment of the invention.

FIG. 7B depicts a second side cross-sectional view of the structure of FIGS. 6A-6C following the formation of the bottom spacers, the gates, the middle-of-line contacts and the back-end-of-line interconnects, and the bonding to the carrier wafer, according to an embodiment of the invention.

FIG. 7C depicts a top-down view of the structure of FIGS. 6A-6C following the formation of the bottom spacers, the gates, the middle-of-line contacts and the back-end-of-line interconnects, and the bonding to the carrier wafer, according to an embodiment of the invention.

FIG. 8A depicts a first side cross-sectional view of the structure of FIGS. 7A-7C following a wafer flip and removal of portions of the substrate stopping on the etch stop layer, according to an embodiment of the invention.

FIG. 8B depicts a second side cross-sectional view of the structure of FIGS. 7A-7C following the wafer flip and the removal of the portions of the substrate stopping on the etch stop layer, according to an embodiment of the invention.

FIG. 8C depicts a top cross-sectional view of the structure of FIGS. 7A-7C following the wafer flip and the removal of the portions of the substrate stopping on the etch stop layer, according to an embodiment of the invention.

FIG. 9A depicts a first side cross-sectional view of the structure of FIGS. 8A-8C following removal of the etch stop layer and remaining portions of the substrate, according to an embodiment of the invention.

FIG. 9B depicts a second side cross-sectional view of the structure of FIGS. 8A-8C following the removal of the etch stop layer and the remaining portions of the substrate, according to an embodiment of the invention.

FIG. 9C depicts a top cross-sectional view of the structure of FIGS. 8A-8C following the removal of the etch stop layer and the remaining portions of the substrate, according to an embodiment of the invention.

FIG. 10A depicts a first side cross-sectional view of the structure of FIGS. 9A-9C following back side contact metallization, according to an embodiment of the invention.

FIG. 10B depicts a second side cross-sectional view of the structure of FIGS. 9A-9C following the back side contact metallization, according to an embodiment of the invention.

FIG. 10C depicts a top cross-sectional view of the structure of FIGS. 9A-9C following the back side contact metallization, according to an embodiment of the invention.

FIG. 11A depicts a first side cross-sectional view of the structure of FIGS. 10A-10C following formation of a back side interlayer dielectric layer and back side interconnects, according to an embodiment of the invention.

FIG. 11B depicts a second side cross-sectional view of the structure of FIGS. 10A-10C following the formation of the back side interlayer dielectric layer and the back side interconnects, according to an embodiment of the invention.

FIG. 11C depicts a top cross-sectional view of the structure of FIGS. 10A-10C following the formation of the back side interlayer dielectric layer and the back side interconnects, according to an embodiment of the invention.

DETAILED DESCRIPTION

Figures 2A, 2B, 2C:
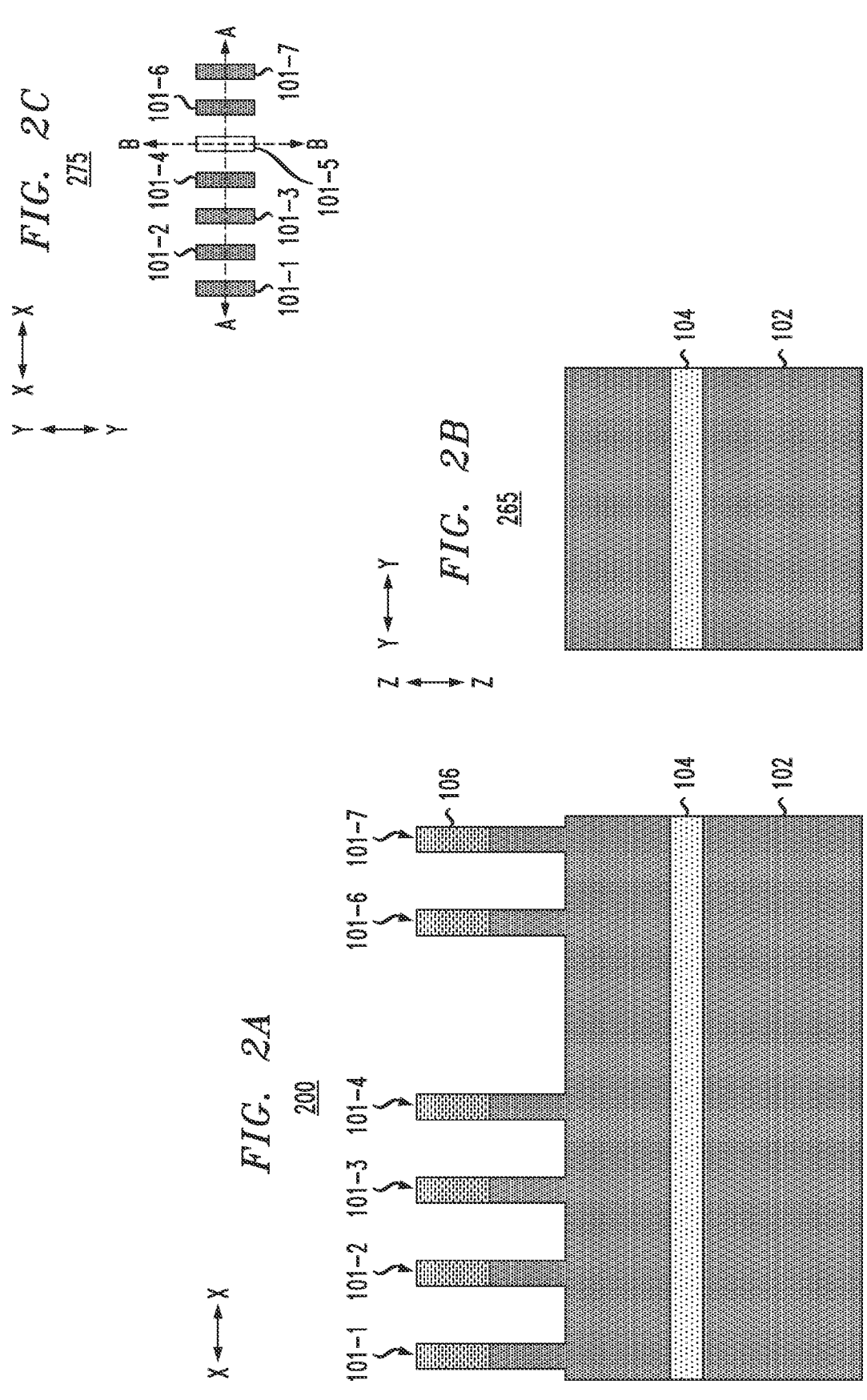
FIG. 2A depicts a first side cross-sectional view of the structure of FIGS. 1A-1C following fin patterning, according to an embodiment of the invention.
FIG. 2B depicts a second side cross-sectional view of the structure of FIGS. 1A-1C following the fin patterning, according to an embodiment of the invention.
FIG. 2C depicts a top-down view of the structure of FIGS. 1A-1C following the fin patterning, according to an embodiment of the invention.

Illustrative embodiments of the invention may be described herein in the context of illustrative methods for forming vertical transport transistor devices with back side interconnects, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

It is to be understood that the various features shown in the accompanying drawings are schematic illustrations that are not necessarily drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the terms "exemplary" and "illustrative" as used herein mean "serving as an example, instance, or illustration." Any embodiment or design described herein as "exemplary" or "illustrative" is not to be construed as preferred or advantageous over other embodiments or designs.

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Increasing demand for high density and performance in integrated circuit devices requires development of new structural and design features, including shrinking gate lengths and other reductions in size or scaling of devices. Continued scaling, however, is reaching limits of conventional fabrication techniques.

Vertical transport FETs (VTFETs) are being pursued as viable CMOS architectures for scaling to 5 nanometers (nm) and beyond. VTFETs provide the opportunity for further device scaling compared with other device architectures. VTFETs have various potential advantages over other conventional structures such as fin field-effect transistors (Fin-FETs). Such advantages may include improvements in density, performance, power consumption, and integration.

VTFETs may use back side interconnects. In some cases, however, it is advantageous to wire bottom source/drain regions of one or more VTFETs to front side signaling. Illustrative embodiments provide techniques for wiring bottom source/drain regions of VTFETs to front side signaling using back side "local" interconnects. Such techniques provide various advantages, including that a single dummy fin structure can accommodate two signal accesses to bottom source/drain regions of VTFETs with such back side local interconnects. The back side local interconnects are illustratively two-dimensional (2D) shapes.

In some embodiments, a semiconductor structure includes a VTFET device with a back side contact under a bottom source/drain region, where the back side contact is confined by shallow trench isolation (STI) regions. A back side local interconnect connects the back side contact to back-end-of-line (BEOL) interconnects on a front side of the structure through a deep contact connecting the front and back sides of the semiconductor structure. The back side local interconnect may have a 2D shape. In some embodiments, two back side contacts can be wired to the front side BEOL interconnects through a single 2D back side local interconnect within a single dummy fin space.

Back side local interconnects for VTFET devices may be formed using the following processing. A bottom source/drain region is formed over a residual semiconductor layer (e.g., a residual silicon (Si) layer) over an etch stop layer of a substrate (e.g., a Si substrate). An STI liner and STI dielectric region are formed to confine the residual semiconductor layer. A bottom spacer, gate, top spacer, top source/drain region and contacts for the VTFET device are then formed. Such contacts include a "deep" contact that extends from a front side of the structure to a back side of the structure through the STI dielectric region. Front side BEOL interconnects are formed, and the front side of the structure is bonded to a carrier wafer for the VTFET device. A wafer flip is then performed, followed by removing the substrate, which stops on the etch stop layer. The etch stop layer is removed, followed by removal of the residual semiconductor layer selective to the STI liner and STI dielectric region, so as to form back side contact cavities. Back side contacts are then formed within the back side contact cavities. A back side "local" interconnect is formed to connect one or more of the back side contacts to the deep contact that extends from the front side to the back side of the structure.

FIGS. 1A-12C show a process flow for forming vertical transport transistor devices with back side interconnects.

FIG. 1A shows a first side cross-sectional view 100 of a structure, following formation of a substrate 102 with an etch stop layer 104. FIG. 1B shows a second side cross-sectional view 165 of the structure, and FIG. 1C shows a top-down view 175 of the structure. The top-down view 175 of FIG. 1C shows regions 101-1 through 101-7 where "fins" and "dummy fins" will be formed from portions of the substrate 102. Here, regions 101-1, 101-2, 101-3, 101-4, 101-6 and 101-7 represent fin regions, while region 101-5 represents a dummy fin region. The first side cross-sectional view 100 of FIG. 1A is taken along the line A-A in the top-down view 175 of FIG. 1C (e.g., across the fin and dummy fin regions 101-1 through 101-7), and the second side cross-sectional view 165 of FIG. 1B is taken along the line B-B in the top-down view 175 of FIG. 1C (e.g., along the dummy fin region 101-5).

The substrate 102 may be formed of any suitable semiconductor structure, including various silicon-containing materials including but not limited to Si, silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc.

An etch stop layer 104 is formed in the substrate 102. The etch stop layer 104 may comprise a buried oxide (BOX) layer or SiGe, or another suitable material such as a III-V semiconductor epitaxial layer. The etch stop layer 104 may have a height (in the Z direction) in the range of 10 to 30 nm.

As shown in FIGS. 1A and 1B, there are portions of the substrate 102 above and below the etch stop layer 104. As will be described in further detail below, portions of substrate 102 above the etch stop layer 104 will provide material for the fin regions 101-1, 101-2, 101-3, 101-4, 101-6 and 101-7, as well as a residual semiconductor layer 111 (shown in FIGS. 4A and 4B) that acts as a placeholder for where back side contacts to bottom source/drain regions of VTFET devices will be formed.

FIG. 2A shows a first side cross-sectional view 200 of the structure of FIGS. 1A-1C following fin patterning. FIG. 2B shows a second side cross-sectional view 265 of the structure of FIGS. 1A-1C following the fin patterning. FIG. 2C shows a top-down view 275 of the structure of FIGS. 1A-1C following the fin patterning. The first side cross-sectional view 200 of FIG. 2A is taken along the line A-A in the top-down view 275 of FIG. 2C, and the second side cross-sectional view 265 of FIG. 2B is taken along the line B-B in the top-down view 275 of FIG. 2C.

The fin patterning process includes forming a hard mask (HM) layer 106 over a top of the substrate 102, followed by patterning to leave the HM layer 106 over portions of the substrate where vertical fins are to be formed for resulting VTFET devices (e.g., the HM layer 106 remains in the fin regions 101-1, 101-2, 101-3, 101-4, 101-6 and 101-7, but the HM layer 106 is removed in the dummy fin region 101-5).

The HM layer 106 may be formed of a nitride such as silicon nitride (SiN), although other suitable materials may be used. The HM layer 106, in some embodiments, may be formed as a multi-layer, such as a multi-layer of two layers including a nitride and oxide (e.g., SiN and silicon dioxide (SiO$_2$)), a multi-layer of three layers including one or more nitride and one or more oxide layers (e.g., SiN/SiO$_2$/SiN, SiO$_2$/SiN/SiO$_2$), etc. The HM layer 106 may have a height (in the Z direction) in the range of 10 nm to 100 nm.

The fin regions 101-1, 101-2, 101-3, 101-4, 101-6 and 101-7 at this step are partially patterned by recessing the top surface of the substrate 102 not covered by the HM layer 106 to a depth (in the Z direction) ranging from 15 to 30 nm. Each of the fin regions 101-1, 101-2, 101-3, 101-4, 101-6 and 101-7 may have a width (in the X direction) in the range of 5 nm to 20 nm.

It should be noted that FIGS. 1A-12C are shown and described with respect to forming six fin regions 101-1, 101-2, 101-3, 101-4, 101-6 and 101-7 and a single dummy fin region 101-5. In other embodiments, however, there may be more or fewer fin regions and dummy fin regions as needed to form desired interconnections.

Figures 3A, 3B, 3C:
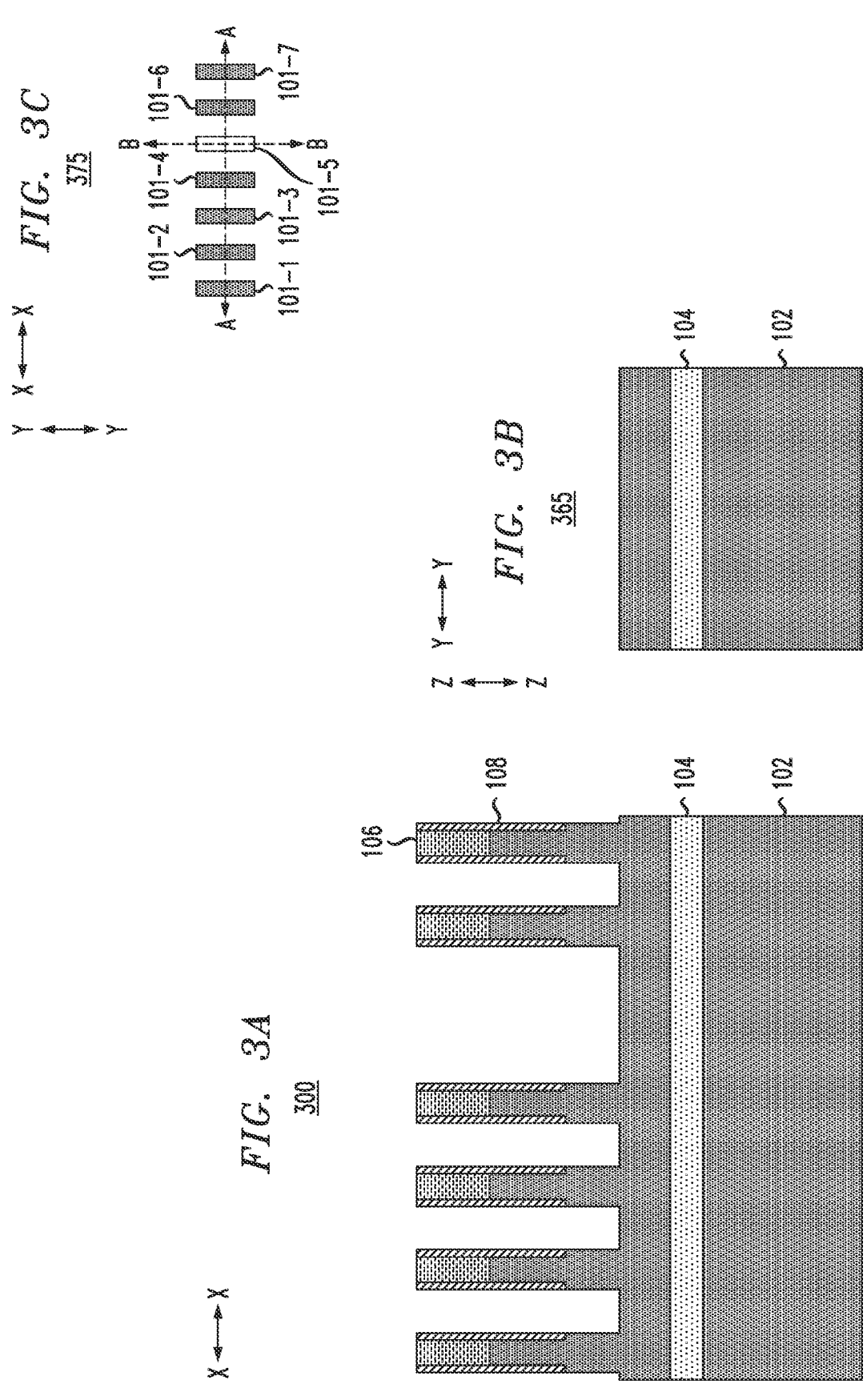
FIG. 3A depicts a first side cross-sectional view of the structure of FIGS. 2A-2C following sidewall protection and fin recess, according to an embodiment of the invention.
FIG. 3B depicts a second side cross-sectional view of the structure of FIGS. 2A-2C following the sidewall protection and the fin recess, according to an embodiment of the invention.
FIG. 3C depicts a top-down view of the structure of FIGS. 2A-2C following the sidewall protection and the fin recess, according to an embodiment of the invention.

FIG. 3A shows a first side cross-sectional view 300 of the structure of FIGS. 2A-2C following sidewall protection and fin recess. FIG. 3B shows a second side cross-sectional view 365 of the structure of FIGS. 2A-2C following the sidewall patterning and the fin recess. FIG. 3C shows a top-down view 375 of the structure of FIGS. 2A-2C following the sidewall patterning and the fin recess. The first side cross-sectional view 300 of FIG. 3A is taken along the line A-A in the top-down view 375 of FIG. 3C, and the second side cross-sectional view 365 of FIG. 3B is taken along the line B-B in the top-down view 375 of FIG. 3C.

The sidewall protection includes deposition of a spacer material over the structure, followed by a directional etching (e.g., using reactive-ion etching (RIE) or other suitable processing) that removes the spacer material from a top surface of the HM layer 106 and the recessed top surface of the substrate 102, resulting in sidewall spacers 108. The sidewall spacers 108 may be formed of SiO2, SiN, titanium oxide (TiO$_x$), aluminum oxide (AlO$_x$), SiC, etc. The sidewall spacers 108 may have a width (in the X direction) in the range of 1 to 4 nm. Once the sidewall spacers 108 are formed, the substrate 102 is further recessed to an additional depth (in the Z direction) in the range of 15 to 50 nm.

Figures 4A, 4B, 4C:
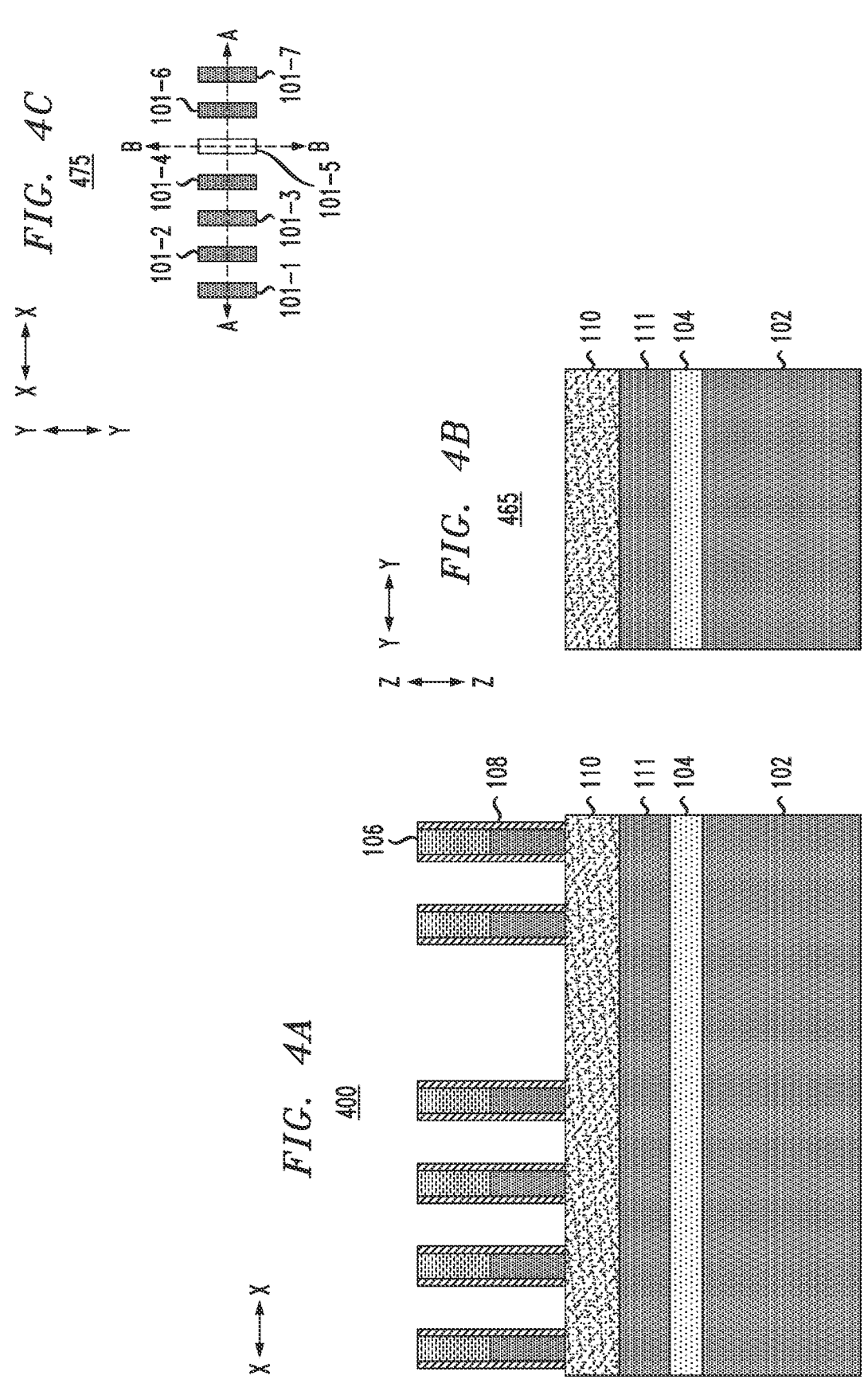
FIG. 4A depicts a first side cross-sectional view of the structure of FIGS. 3A-3C following formation of bottom source/drain regions, according to an embodiment of the invention.
FIG. 4B depicts a second side cross-sectional view of the structure of FIGS. 3A-3C following the formation of the bottom source/drain regions, according to an embodiment of the invention.
FIG. 4C depicts a top-down view of the structure of FIGS. 3A-3C following the formation of the bottom source/drain regions, according to an embodiment of the invention.

FIG. 4A shows a first side cross-sectional view 400 of the structure of FIGS. 3A-3C following formation of bottom source/drain regions 110. FIG. 4B shows a second side cross-sectional view 465 of the structure of FIGS. 3A-3C following the formation of the bottom source/drain regions 110. FIG. 4C shows a top-down view 475 of the structure of FIGS. 3A-3C following the formation of the bottom source/drain regions 110. The first side cross-sectional view 400 of FIG. 4A is taken along the line A-A in the top-down view 475 of FIG. 4C, and the second side cross-sectional view 465 of FIG. 4B is taken along the line B-B in the top-down view 475 of FIG. 4C.

The bottom source/drain regions 110 may be formed using epitaxial growth processes, and thus may also be referred to as bottom epitaxial layers 110. The bottom source/drain regions 110 may be suitably doped, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride ($BF_2$), gallium (Ga), indium (In), and thallium (Tl). In some embodiments, the epitaxy process used for forming the bottom source/drain regions 110 comprises in-situ doping (dopants are incorporated in epitaxy material during epitaxy). Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants (e.g., phosphorus or arsenic) or p-type dopants (e.g., boron or gallium), depending on the type of transistor to be formed. The dopant concentration in the source/drain can range from $1 \times 10^{19}$ cm$^{-3}$ to $3 \times 10^{21}$ cm$^{-3}$, or preferably between $2 \times 10^{20}$ cm$^{-3}$ to $3 \times 10^{21}$ cm$^{-3}$. After bottom S/D epi growth, a dopant drive-in anneal process can be performed to move the dopant closer to the bottom of the fins. The bottom source/drain regions 110 may have a height (in the Z direction) in the range of 15 to 50 nm.

FIG. 5A shows a first side cross-sectional view 500 of the structure of FIGS. 4A-4C following active region patterning. FIG. 5B shows a second side cross-sectional view 565 of the structure of FIGS. 4A-4C following the active region patterning. FIG. 5C shows a top-down view 575 of the structure of FIGS. 4A-4C following the active region patterning. The first side cross-sectional view 500 of FIG. 5A is taken along the line A-A in the top-down view 575 of FIG. 5C, and the second side cross-sectional view 565 of FIG. 5B is taken along the line B-B in the top-down view 575 of FIG. 5C.

The active region patterning, as shown in FIGS. 5A and 5B, includes etching through the portions of the bottom source/drain regions 110, the substrate 102, and into the etch stop layer 104 which are exposed by the HM layer 106 and sidewall spacers 108. The etch stop layer 104 may be etched through to a depth (in the Z direction) in the range of 0 to 15 nm. Portions of the substrate 102 which remain above the etch stop layer 104 provide a "residual" semiconductor layer 111.

FIG. 6A shows a first side cross-sectional view 600 of the structure of FIGS. 5A-5C following formation of STI structures. FIG. 6B shows a second side cross-sectional view 665 of the structure of FIGS. 5A-5C following the formation of the STI structures. FIG. 6C shows a top-down view 675 of the structure of FIGS. 5A-5C following the formation of the STI structures. The first side cross-sectional view 600 of FIG. 6A is taken along the line A-A in the top-down view 675 of FIG. 6C, and the second side cross-sectional view 665 of FIG. 6B is taken along the line B-B in the top-down view 675 of FIG. 6C.

Formation of the STI structures includes forming a STI liner 112 followed by STI regions 114. The STI liner 112 may be formed of SiN or another suitable material such as silicon boron carbide nitride (SiBCN), silicon oxycarbonitride (SiOCN), SiOC, SiC, etc. The STI liner 112 may have a uniform thickness in the range of 2 to 6 nm. The STI regions 114 may be formed of a dielectric material such as silicon dioxide ($SiO_2$), silicon oxycarbide (SiOC), silicon oxynitride (SiON), etc. The STI regions 114 may have a height (in the Z direction) in the range of 30 to 150 nm.

FIG. 7A shows a first side cross-sectional view 700 of the structure of FIGS. 6A-6C following formation of bottom spacers 116, gate stacks 118, top source/drain regions 120, top spacers 122, front side interlayer dielectric (ILD) layer 124, middle-of-line (MOL) contacts 126 and 128, and BEOL interconnects 130, and bonding of the structure to a carrier wafer 132. FIG. 7B shows a second side cross-sectional view 765 of the structure of FIGS. 6A-6C following the formation of the bottom spacers 116, the gate stacks 118, the top source/drain regions 120, the top spacers 122, the front side ILD layer 124, the MOL contacts 126 and 128, and the BEOL interconnects 130, and the bonding of the structure to the carrier wafer 132. FIG. 7C shows a top-down view 775 of the structure of FIGS. 6A-6C following the formation of the bottom spacers 116, the gate stacks 118, the top source/drain regions 120, the top spacers 122, the front side ILD layer 124, the MOL contacts 126 and 128, and the BEOL interconnects 130, and the bonding of the structure to the carrier wafer 132. The first side cross-sectional view 700 of FIG. 7A is taken along the line A-A in the top-down view 775 of FIG. 7C, and the second side cross-sectional view 765 of FIG. 7B is taken along the line B-B in the top-down view 775 of FIG. 7C.

The bottom spacers 116 may be formed using various processing, such as using conformal deposition and etch-back processing (e.g., atomic layer deposition (ALD), etc.), or a directional dielectric deposition process. The bottom spacers 116 may be formed of silicon dioxide ($SiO_2$), SiN, silicon carbide oxide (SiCO), SiBCN, SiOCN, etc., although other suitable materials may be used. The bottom spacers 116 may have a height (in the Z direction) in the range of 4 to 10 nm.

The gate stacks 118 may comprise a gate dielectric layer and a gate conductor layer. The gate dielectric layer may be formed of a high-k dielectric material. Examples of high-k materials include but are not limited to metal oxides such as $HfO_2$, hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k material may further include dopants such as lanthanum (La), aluminum (Al), and magnesium (Mg). The gate dielectric layer may have a uniform thickness in the range of 1 nm to 3 nm.

The gate conductor layer may include a metal gate or work function metal (WFM). The WFM for the gate conductor layer may be titanium (Ti), titanium nitride (TiN), tantalum (Ta), tantalum nitride (TaN), aluminum (Al), titanium aluminum (TiAl), titanium aluminum carbon (TiAlC), a combination of Ti and Al alloys, a stack which includes a barrier layer (e.g., of TiN, TaN, etc.) followed by one or more of the aforementioned WFM materials, etc. It should be appreciated that various other materials may be used for the gate conductor layer as desired.

The top source/drain regions 120 may be formed of similar materials and with similar sizing and processing as that of the bottom source/drain regions 110.

The top spacers 122 may be formed of similar materials and with similar sizing and processing as that of the bottom spacers 116.

The front side ILD layer 124 is formed over the structure, and the front side ILD layer 124 may be formed of any suitable isolating material, such as $SiO_2$, SiOC, SiON, etc. The front side ILD layer 124 may be formed to overfill the structure, and may be planarized (e.g., using chemical mechanical planarization (CMP) or other suitable processing).

The MOL contacts 126 are formed by patterning openings in the front side ILD layer 124, followed by deposition and planarization (e.g., using CMP or other suitable processing) of the contact material. The MOL contact 128 is formed by patterning an opening in the front side ILD layer 124 as well as the underlaying bottom spacers 116, STI region 114, and STI liner 112, followed by deposition and planarization (e.g., using CMP or other suitable processing) of the contact material. The contact material may include a silicide layer such as titanium (Ti), nickel (Ni), nickel platinum (NiPt), etc., a metal adhesion layer (e.g., such as TiN) and a low resistance metal such as ruthenium (Ru), tungsten (W), cobalt (Co) or another suitable material. The MOL contacts 126 are formed to connect to respective pairs of the top source/drain regions 120, while the MOL contact 128 provides a "deep" contact that will connect the front side and back side of the structure.

The BEOL interconnects 130 include various BEOL interconnect structures. The carrier wafer 132 may be formed of materials similar to that of the substrate 102, and may be formed over the BEOL interconnects 130 using a wafer bonding process, such as dielectric-to-dielectric bonding.

FIG. 8A shows a first side cross-sectional view 800 of the structure of FIGS. 7A-7C following a wafer flip and removal of portions of the substrate 102 stopping on the etch stop layer 104. FIG. 8B shows a second side cross-sectional view 865 of the structure of FIGS. 7A-7C following the wafer flip and the removal of the portions of the substrate 102 stopping on the etch stop layer 104. FIG. 8C shows a top cross-sectional view 875 (e.g., showing where the MOL contacts 126 and 128 are formed relative to the fin regions 101-1, 101-2, 101-3, 101-4, 101-6 and 101-7 and the dummy fin region 101-5) of the structure of FIGS. 7A-7C following the wafer flip and the removal of the portions of the substrate 102 stopping on the etch stop layer 104. The first side cross-sectional view 800 of FIG. 8A is taken along the line A-A in the top cross-sectional view 875 of FIG. 8C, and the second side cross-sectional view 865 of FIG. 8B is taken along the line B-B in the top cross-sectional view 875 of FIG. 8C.

Using the carrier wafer 132, the structure may be "flipped" and portions of the substrate 102 may be removed from the back side. Removal of the portions of the substrate 102 will stop on the etch stop layer 104 as illustrated in FIGS. 8A and 8B.

FIG. 9A shows a first side cross-sectional view 900 of the structure of FIGS. 8A-8C following removal of the etch stop layer 104 and the residual semiconductor layer 111. FIG. 9B shows a second side cross-sectional view 965 of the structure of FIGS. 8A-8C following the removal of the etch stop layer 104 and the residual semiconductor layer 111. FIG. 9C shows a top cross-sectional view 975 of the structure of FIGS. 8A-8C (e.g., showing where the MOL contacts 126 and 128 are formed relative to the fin regions 101-1, 101-2, 101-3, 101-4, 101-6 and 101-7 and the dummy fin region 101-5) following the removal of the etch stop layer 104 and the residual semiconductor layer 111. The first side cross-sectional view 900 of FIG. 9A is taken along the line A-A in the top cross-sectional view 975 of FIG. 9C, and the second side cross-sectional view 965 of FIG. 9B is taken along the line B-B in the top cross-sectional view 975 of FIG. 9C.

As shown in FIGS. 9A and 9B, the etch stop layer 104 is removed, followed by removal of the remaining portions of the residual semiconductor layer 111 (e.g., remaining portions of the substrate 102).

FIG. 10A shows a first side cross-sectional view 1000 of the structure of FIGS. 9A-9C following back side contact metallization. FIG. 10B shows a second side cross-sectional view 1065 of the structure of FIGS. 10A-10C following the back side contact metallization. FIG. 10C shows a top cross-sectional view 1075 of the structure of FIGS. 9A-9C (e.g., showing where the MOL contacts 126 and 128 are formed relative to the fin regions 101-1, 101-2, 101-3, 101-4, 101-6 and 101-7 and the dummy fin region 101-5) following the back side contact metallization. The first side cross-sectional view 1000 of FIG. 10A is taken along the line A-A in the top cross-sectional view 1075 of FIG. 10C, and the second side cross-sectional view 1065 of FIG. 10B is taken along the line B-B in the top cross-sectional view 1075 of FIG. 10C.

The back side contact metallization includes formation of back side contacts 134 that connect to the bottom source/drain regions 110. The back side contacts 134 may be formed by deposition of contact material in the cavities formed by removal of the residual semiconductor layer 111 (e.g., defined by the STI liner 112 and the bottom source/drain regions 110). The contact material used for the back side contacts 134 may be similar to the contact material used for the MOL contacts 126 and 128.

FIG. 11A shows a first side cross-sectional view 1100 of the structure of FIGS. 10A-10C following formation of a back side ILD layer 136 and back side interconnects 138, 140 and 142. FIG. 11B shows a second side cross-sectional view 1165 of the structure of FIGS. 10A-10C following the formation of the back side ILD layer 136 and the back side interconnects 138, 140 and 142. FIG. 11C shows a top cross-sectional view 1175 of the structure of FIGS. 10A-10C following the formation of the back side ILD layer 136 and the back side interconnects 138, 140 and 142 (e.g., showing where the back side interconnects 138, 140 and 142 are formed relative to the fin regions 101-1, 101-2, 101-3, 101-4, 101-6 and 101-7 and the dummy fin region 101-5). The first side cross-sectional view 1100 of FIG. 11A is taken along the line A-A in the top cross-sectional view 1175 of FIG. 11C, and the second side cross-sectional view 1165 of FIG. 11B is taken along the line B-B in the top cross-sectional view 1175 of FIG. 11C.

The back side ILD layer 136 may be formed of similar materials and processing as the front side ILD layer 124. The back side ILD layer 136 may be deposited and planarized, followed by patterning openings therein where the back side interconnects 138, 140 and 142 are formed. The back side interconnects 138, 140 and 142 may be formed of copper (Cu), ruthenium (Ru), tungsten (W), cobalt (Co), etc., with a thin adhesion liner formed of titanium nitride (TiN) or another suitable material.

The back side interconnects 138, 140 and 142 provide "local" interconnects. The back side interconnect 138 connects the bottom source/drain regions 110 for the fin regions 101-1 and 101-2 together. The back side interconnect 140 connects the bottom source/drain regions 110 for the fin regions 101-3 and 101-4 together in a "first" direction, and to a first portion of the dummy fin region 101-5 in a "second" direction for connection to the MOL contact 128. The back side interconnect 142 connects the bottom source/drain regions 110 for the fin regions 101-6 and 101-7 together in the "first" direction, and to a second portion of the dummy fin region 101-5 in the "second" direction for connection to an MOL contact (not shown) which, similar to the MOL contact 128, connects the front side and the back side of the structure. The back side interconnects 140 and 142 are thus "2D" local interconnects. The back side interconnect 140 enables the bottom source/drain regions 110 of the fin regions 101-3 and 101-4 to connect to front side signaling of the BEOL interconnects 130 via the MOL contact 128 that extends from the front side to the back side of the structure. The back side interconnect 142 similarly enables the bottom source/drain regions 110 of the fin regions 101-6 and 101-7 to connect to front side signaling of the BEOL interconnects 130 via the other MOL contact (not shown) that extends from the front side to the back side of the structure.

Figures 12A, 12B, 12C, 13:
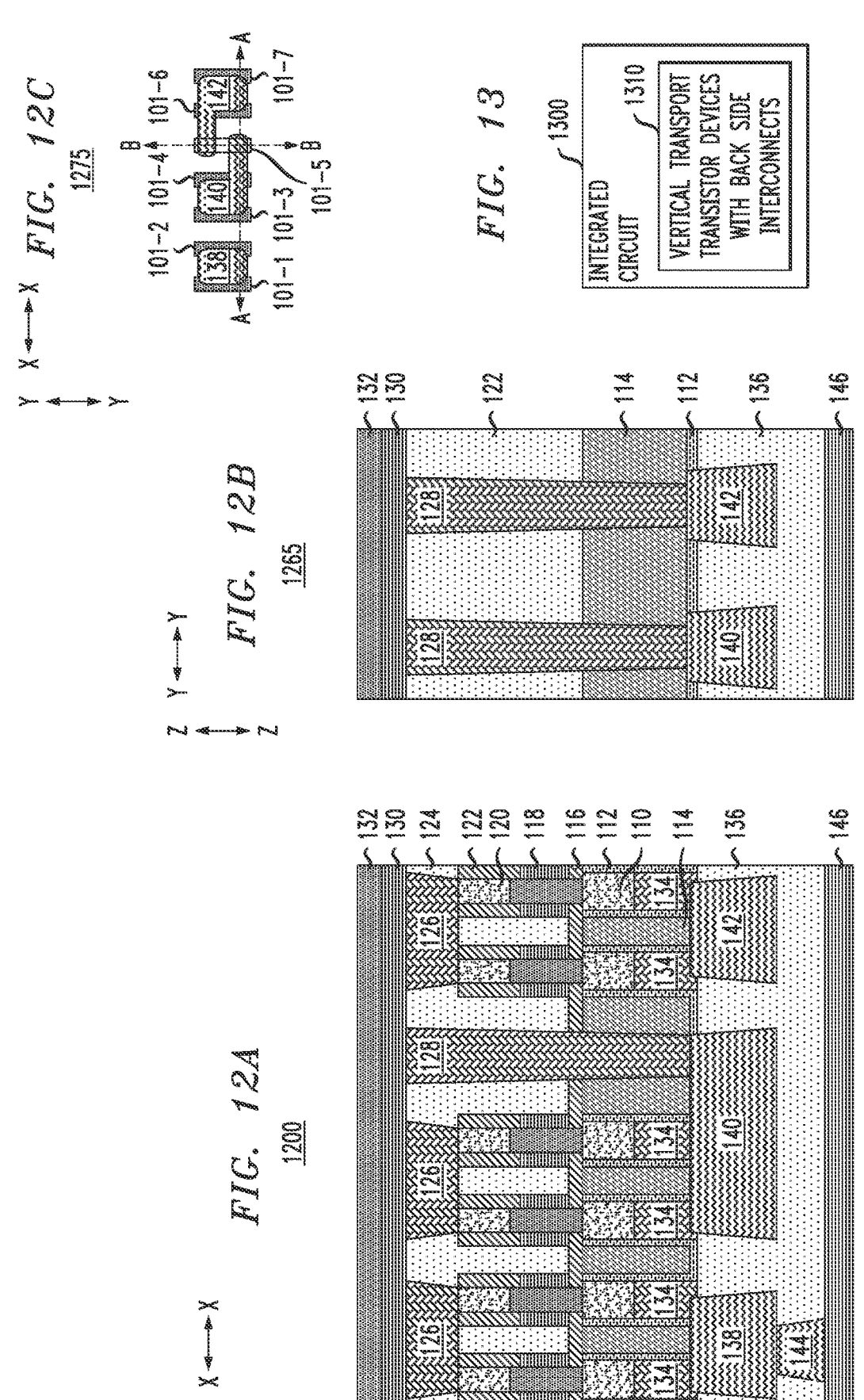
FIG. 12A depicts a first side cross-sectional view of the structure of FIGS. 11A-11C following formation of a back side power distribution network, according to an embodiment of the invention.
FIG. 12B depicts a second side cross-sectional view of the structure of FIGS. 11A-11C following the formation of the back side power distribution network, according to an embodiment of the invention.
FIG. 12C depicts a top cross-sectional view of the structure of FIGS. 11A-11C following the formation of the back side power distribution network, according to an embodiment of the invention.
FIG. 13 depicts an integrated circuit comprising vertical transport transistor devices with back side interconnects, according to an embodiment of the invention.

FIG. 12A shows a first side cross-sectional view 1200 of the structure of FIGS. 11A-11C following formation of a via 144 and a back side power distribution network (BSPDN) 146. FIG. 12B shows a second side cross-sectional view 1265 of the structure of FIGS. 11A-11C following the formation of the via 144 and the BSPDN 146. FIG. 12C shows a top cross-sectional view 1275 of the structure of FIGS. 11A-11C following the formation of the via 144 and the BSPDN 146 (e.g., showing where the back side interconnects 138, 140 and 142 are formed relative to the fin regions 101-1, 101-2, 101-3, 101-4, 101-6 and 101-7 and the dummy fin region 101-5). The first side cross-sectional view 1200 of FIG. 12A is taken along the line A-A in the top cross-sectional view 1275 of FIG. 12C, and the second side cross-sectional view 1265 of FIG. 12B is taken along the line B-B in the top cross-sectional view 1275 of FIG. 12C.

The via 144 may be formed by depositing additional material for the back side ILD layer 136, and patterning an opening in the back side ILD layer 136. The via 144 is then filled in the opening in the back side ILD layer 136 to connect to the back side interconnect 138. The via 144 may be formed of similar materials as the back side interconnects 138, 140 and 142. The via 144 may have a width (in the X direction) in the range of 10 to 50 nm, and a height (in the Z direction) in the range of 20 to 100 nm.

The BSPDN 146 is then formed, which connects to the back side interconnect 138 through the via 144. The BSPDN 146 may be formed with similar sizing as that of the BEOL interconnects 130.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, complementary metal-oxide-semiconductors (CMOSs), metal-oxide-semiconductor field-effect transistors (MOSFETs), and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor. FIG. 13 shows an example integrated circuit 1300 which includes one or more vertical transport transistor devices 1310 with back side interconnects.

In some embodiments, a semiconductor structure comprises a vertical transistor, a first contact connecting to a source/drain region at a first side of the vertical transistor, a second contact extending from the first side of the vertical transistor to a second side of the vertical transistor, and an interconnect structure at the first side of the vertical transistor connecting the first contact to the second contact.

The second contact may connect to one or more BEOL interconnects at the second side of the vertical transistor.

The first contact may be confined by one or more STI region structures.

The interconnect structure may further connect the second contact to a third contact, the third contact connecting to a source/drain region at a first side of an additional vertical transistor.

The second contact may be in a dummy fin region on one side of (i) a first fin region providing a channel for the vertical transistor and (ii) a second fin region providing a channel for the additional vertical transistor. The semiconductor structure may further comprise at least a third fin region providing a channel for another additional vertical transistor on another side of the dummy fin region, a fourth contact in the dummy fin region, the fourth contact extending from the first side of the vertical transistor to the second side of the vertical transistor, and an additional interconnect structure connecting the fourth contact to a fifth contact, the fifth contact connecting to a source/drain region at a first side of the another additional vertical transistor.

The second contact may be in a dummy fin region between (i) a first fin region providing a channel for the vertical transistor and (ii) a second fin region providing a channel for an additional vertical transistor. The semiconductor structure may further comprise a third contact in the dummy fin region, the third contact extending from the first side of the vertical transistor to the second side of the vertical transistor, and an additional interconnect structure connecting the third contact to a fourth contact, the fourth contact connecting to a source/drain region at a first side of the additional vertical transistor.

The semiconductor structure may further comprise an ILD layer surrounding the first contact. The semiconductor structure may further comprise a third contact disposed in the ILD layer connecting to a source/drain region at a first side of an additional vertical transistor, the third contact connecting to a power distribution network at the first side of the additional vertical transistor.

In some embodiments, an integrated circuit comprises a semiconductor structure comprising a vertical transistor, a first contact connecting to a source/drain region at a first side of the vertical transistor, a second contact extending from the first side of the vertical transistor to a second side of the vertical transistor, and an interconnect structure at the first side of the vertical transistor connecting the first contact to the second contact.

The second contact may connect to one or more BEOL interconnects at the second side of the vertical transistor.

The second contact may be in a dummy fin region between (i) a first fin region providing a channel for the vertical transistor and (ii) a second fin region providing a channel for an additional vertical transistor. The semiconductor structure may further comprise: a third contact in the dummy fin region, the third contact extending from the first side of the vertical transistor to the second side of the vertical transistor, and an additional interconnect structure connecting the third contact to a fourth contact, the fourth contact connecting to a source/drain region at a first side of the additional vertical transistor.

In some embodiments, a method comprises forming a vertical transistor, forming a first contact connecting to a source/drain region at a first side of the vertical transistor, forming a second contact extending from the first side of the vertical transistor to a second side of the vertical transistor, and forming an interconnect structure at the first side of the vertical transistor connecting the first contact to the second contact.

Forming the vertical transistor may comprise forming the source/drain region over a residual semiconductor layer, the residual semiconductor layer being formed over an etch stop layer formed over a substrate. Forming the vertical transistor may further comprise forming a STI region structure that confines the residual semiconductor layer beneath a portion of the source/drain region beneath a fin region providing a channel for the vertical transistor.

Forming the vertical transistor may further comprise forming a gate stack over the source/drain region surrounding the fin region providing the channel for the vertical transistor and forming another source/drain region, at the second side of the vertical transistor, over the fin region providing the channel for the vertical transistor. The second contact may be formed in a dummy fin region on one side of the fin region providing the channel for the vertical transistor, the second contact extending from the second side of the vertical transistor and through the STI region structure to the etch stop layer.

Forming the first contact may comprise removing the substrate, removing the etch stop layer, removing the residual semiconductor layer to form a cavity, and forming the first contact in the cavity. Forming the interconnect structure may comprise forming an ILD layer, patterning an opening in the ILD layer that extends from the first contact to the second contact at the first side of the vertical transistor, and forming the interconnect structure in the opening in the ILD layer.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms "approximately" or "substantially" as used herein with regard to thicknesses, widths, percentages, ranges, temperatures, times and other process parameters, etc., are meant to denote being close or approximate to, but not exactly. For example, the term "approximately" or "substantially" as used herein implies that a small margin of error is present, such as ±5%, preferably less than 2% or 1% or less than the stated amount.

In the description above, various materials, dimensions and processing parameters for different elements are provided. Unless otherwise noted, such materials are given by way of example only and embodiments are not limited solely to the specific examples given. Similarly, unless otherwise noted, all dimensions and process parameters are given by way of example and embodiments are not limited solely to the specific dimensions or ranges given.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:

a first vertical transistor;

a second vertical transistor;

a first contact connecting to a source/drain region at a first side of the first vertical transistor;

a second contact extending from the first side of the first vertical transistor to a second side of the first vertical transistor;

a third contact connecting to a source/drain region at a first side of the second vertical transistor;

a fourth contact extending from the first side of the second vertical transistor to a second side of the second vertical transistor;

a first interconnect structure at the first side of the first vertical transistor connecting the first contact to the second contact; and a second interconnect structure at the first side of the second vertical transistor connecting the third contact to the fourth contact;

wherein the second contact and the fourth contact are disposed in a region between the first vertical transistor and the second vertical transistor.

2. The semiconductor structure of claim 1, wherein the second contact connects to one or more back-end-of-line interconnects at the second side of the first vertical transistor.

3. The semiconductor structure of claim 1, wherein the first contact is confined by one or more shallow trench isolation region structures.

4. The semiconductor structure of claim 1, wherein the second contact and the fourth contact are in a dummy fin region on one side of (i) a first fin region providing a channel for the first vertical transistor and (ii) a second fin region providing a channel for the second vertical transistor.

5. The semiconductor structure of claim 1, further comprising an interlayer dielectric layer surrounding the first contact.

6. The semiconductor structure of claim 5, further comprising a fifth contact disposed in the interlayer dielectric layer connecting to a source/drain region at the first side of the second vertical transistor, the fifth contact connecting to a power distribution network at the first side of the second vertical transistor.

7. A semiconductor structure comprising:

a vertical transistor;

a first contact connecting to a source/drain region at a first side of the vertical transistor;

a second contact extending from the first side of the vertical transistor to a second side of the vertical transistor; and an interconnect structure at the first side of the vertical transistor connecting the first contact to the second contact;

wherein the second contact is in a dummy fin region between (i) a first fin region providing a channel for the vertical transistor and (ii) a second fin region providing a channel for an additional vertical transistor.

8. The semiconductor structure of claim 7, further comprising:

a third contact in the dummy fin region, the third contact extending from the first side of the vertical transistor to the second side of the vertical transistor; and an additional interconnect structure connecting the third contact to a fourth contact, the fourth contact connecting to a source/drain region at a first side of the additional vertical transistor.

9. The semiconductor structure of claim 7, wherein the second contact connects to one or more back-end-of-line interconnects at the second side of the vertical transistor.

10. The semiconductor structure of claim 7, wherein the first contact is confined by one or more shallow trench isolation region structures.

11. The semiconductor structure of claim 7, further comprising an interlayer dielectric layer surrounding the first contact.

12. The semiconductor structure of claim 11, further comprising a third contact disposed in the interlayer dielectric layer connecting to a source/drain region at a first side of an additional vertical transistor, the third contact connecting to a power distribution network at the first side of the additional vertical transistor.

13. An integrated circuit comprising:

a semiconductor structure comprising:

a first vertical transistor;

a second vertical transistor;

a first contact connecting to a source/drain region at a first side of the first vertical transistor;

a second contact extending from the first side of the first vertical transistor to a second side of the first vertical transistor;

a third contact connecting to a source/drain region at a first side of the second vertical transistor;

a fourth contact extending from the first side of the second vertical transistor to a second side of the second vertical transistor;

a first interconnect structure at the first side of the first vertical transistor connecting the first contact to the second contact; and a second interconnect structure at the first side of the second vertical transistor connecting the third contact to the fourth contact;

wherein the second contact and the fourth contact are disposed in a region between the first vertical transistor and the second vertical transistor.

14. The integrated circuit of claim 13, wherein the second contact connects to one or more back-end-of-line interconnects at the second side of the first vertical transistor.

15. The integrated circuit of claim 13, wherein the second contact and the fourth contact are in a dummy fin region between (i) a first fin region providing a channel for the first vertical transistor and (ii) a second fin region providing a channel for the second vertical transistor.

16. The integrated circuit of claim 13, wherein the first contact is confined by one or more shallow trench isolation region structures.

17. The integrated circuit of claim 13, wherein the semiconductor structure further comprises an interlayer dielectric layer surrounding the first contact.

18. The integrated circuit of claim 17, wherein the semiconductor structure further comprises a fifth contact disposed in the interlayer dielectric layer connecting to a source/drain region at the first side of the second vertical transistor, the fifth contact connecting to a power distribution network at the first side of the second vertical transistor.

* * * * *